(12) United States Patent
Kang et al.

(10) Patent No.: US 8,952,452 B2
(45) Date of Patent: Feb. 10, 2015

(54) SEMICONDUCTOR DEVICES AND METHOD OF MANUFACTURING THE SAME

(71) Applicant: Samsung Electronics Co., Ltd., Suwon-Si, Gyeonggi-Do (KR)

(72) Inventors: Hong-Seong Kang, Hwaseong-Si (KR); Yoon-Hae Kim, Suwon-Si (KR); Jong-Shik Yoon, Yongin-Si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 2 days.

(21) Appl. No.: 13/692,012

(22) Filed: Dec. 3, 2012

(65) Prior Publication Data
US 2013/0248950 A1 Sep. 26, 2013

(30) Foreign Application Priority Data

Mar. 20, 2012 (KR) .................. 10-2012-0028305

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |
| H01L 29/78 | (2006.01) |

(Continued)

(52) U.S. Cl.
CPC .............. *H01L 29/78* (2013.01); *H01L 29/401* (2013.01); *H01L 21/76897* (2013.01); *H01L 29/4991* (2013.01); *H01L 29/6653* (2013.01); *H01L 29/66545* (2013.01); *H01L 29/6656* (2013.01); *H01L 21/823456* (2013.01); *H01L 21/7682* (2013.01); *H01L 21/823468* (2013.01); *H01L 29/41783* (2013.01); *H01L 29/4958* (2013.01); *H01L 29/4966* (2013.01); *H01L 27/088* (2013.01)
USPC ..... 257/346; 257/760; 257/774; 257/E21.006; 257/E21.027; 257/E21.058; 257/E21.17; 257/E21.168; 257/E21.231; 257/E21.253; 257/E21.267; 257/E21.278; 257/E21.293; 257/E21.304; 257/E21.499; 257/E21.507; 257/E21.508

(58) Field of Classification Search
USPC ......... 257/346, 318, 197, 198, 396, 310, 701, 257/760, 774, E21.006, E21.027, E21.058, 257/E21.17, E21.168, E21.231, E21.253, 257/E21.267, E21.278, E21.293, E21.304, 257/E21.499, E21.507, E21.548
See application file for complete search history.

(56) References Cited

U.S. PATENT DOCUMENTS

| | | | | |
|---|---|---|---|---|
| 5,874,765 | A | * 2/1999 | Lee et al. | ........ 257/410 |
| 5,972,763 | A | 10/1999 | Chou et al. | |
| 6,001,695 | A | * 12/1999 | Wu | ........ 438/289 |
| 6,127,712 | A | * 10/2000 | Wu | ........ 257/410 |

(Continued)

FOREIGN PATENT DOCUMENTS

| | | |
|---|---|---|
| KR | 20100121884 A | 11/2010 |
| KR | 20110033654 A | 3/2011 |

*Primary Examiner* — David Nhu
(74) *Attorney, Agent, or Firm* — Harness, Dickey & Pierce P.L.C.

(57) ABSTRACT

Semiconductor devices, and a method of manufacturing the same, include a gate insulating film pattern over a semiconductor substrate. A gate electrode is formed over the gate insulating film pattern. A spacer structure is formed on at least one side of the gate electrode and the gate insulating film pattern. The spacer structure includes a first insulating film spacer contacting the gate insulating film pattern, and a second insulating film spacer on an outer side of the first insulating film spacer. The semiconductor device has an air gap between the first insulating film spacer and the second insulating film spacer.

14 Claims, 15 Drawing Sheets

(51) Int. Cl.
*H01L 29/40* (2006.01)
*H01L 21/768* (2006.01)
*H01L 29/49* (2006.01)
*H01L 29/66* (2006.01)
*H01L 21/8234* (2006.01)
*H01L 29/417* (2006.01)
*H01L 27/088* (2006.01)

(56) References Cited

U.S. PATENT DOCUMENTS

| | | | |
|---|---|---|---|
| 6,180,988 B1 * | 1/2001 | Wu | 257/410 |
| 6,468,877 B1 * | 10/2002 | Pradeep et al. | 438/421 |
| 6,894,357 B2 | 5/2005 | Guo | |
| 2011/0237075 A1 | 9/2011 | Nitta et al. | |

* cited by examiner

SEMICONDUCTOR DEVICES AND METHOD OF MANUFACTURING THE SAME

This application claims the benefit of priority under 35 U.S.C. §119 from Korean Patent Application No. 10-2012-0028305 filed on Mar. 20, 2012 in the Korean Intellectual Property Office, the disclosure of which is incorporated herein by reference in its entirety.

BACKGROUND

1. Field

Example embodiments relate to semiconductor devices and/or a method of manufacturing the same.

2. Description of the Related Art

As semiconductor devices become more highly integrated, the size of wirings included in the semiconductor devices and the gap between the wirings are being rapidly reduced. Wirings are typically made of a metal material with low resistivity. When the wirings made of the metal material with low resistivity are placed at small distances from each other, the parasitic capacitance between the wirings may become very high. Therefore, various methods of reducing the parasitic capacitance between the wirings have been researched. As one of the methods, an air gap spacer is being researched.

SUMMARY

Example embodiments relate to semiconductor devices and/or a method of manufacturing the same.

According to one example embodiment, there is provided a semiconductor device which has improved operating performance due to reduced parasitic capacitance between a contact and a gate structure.

According to another example embodiment, there is provided a method of manufacturing a semiconductor device which has improved operating performance due to reduced parasitic capacitance between a contact and a gate structure.

However, aspects of the disclosure are not restricted to those set forth herein. The above and other aspects will become more apparent to one of ordinary skill in the art to which the disclosure pertains by referencing the detailed description given below.

According to yet another example embodiment, there is provided a semiconductor device comprising a gate insulating film pattern over a semiconductor substrate; a gate electrode over the gate insulating film pattern; and a spacer structure on at least one side of the gate electrode and the gate insulating film pattern, wherein the spacer structure includes a first insulating film spacer contacting the gate insulating film pattern and a second insulating film spacer on an outer side of the first insulating film spacer. The semiconductor device has an air gap between the first insulating film spacer and the second insulating film spacer.

Thicknesses of the first and second insulating film spacers may be different from a thickness of the air gap. The thickness of the air gap may be greater than the thicknesses of the first and second insulating film spacers.

The semiconductor device may further include a mask film pattern over the gate electrode.

The semiconductor device may further include a self-aligned contact adjacent to the spacer structure.

The mask film pattern and the first insulating film spacer may comprise the same materials. The first insulating film spacer and the second insulating film spacer may comprise the same materials.

The semiconductor device may further include an interlayer insulating film on that semiconductor substrate. The second insulating film spacer may have an etching selectivity with respect to the interlayer insulating film.

The gate electrode may comprise a metal gate electrode, and the semiconductor device may further include a metal having a work function formed between the gate insulating film pattern and the metal gate electrode. The metal having the work function may extend along both sidewalls of the metal gate electrode.

According to still another example embodiment, there is provided a method of manufacturing a semiconductor device, the method comprising providing a gate structure including a gate insulating film pattern formed over a semiconductor substrate and a gate electrode formed over the gate insulating film pattern; providing a spacer structure including a first insulating film spacer formed on at least one side of the gate structure to contact the gate insulating film pattern and third and second insulating film spacers sequentially formed on an outer side of the first insulating film spacer; forming a first interlayer insulating film on the semiconductor substrate; selectively removing the third insulating film spacer using an etching selectivity between the first and second insulating film spacers and the third insulating film spacer; and forming a second interlayer insulating film on the spacer structure such that an air gap is formed between the first and second insulating film spacers.

The selectively removing of the third insulating film spacer may include simultaneously etching the first interlayer insulating film and the third insulating film spacer.

The first and second insulating film spacers may each comprise a silicon nitride film nitride film spacer, and the third insulating film spacer may comprise a silicon oxide film spacer.

The method may further include replacing the gate electrode with a metal gate electrode.

The method may further include forming a self-aligned contact adjacent to the spacer structure.

According to a further example embodiment, a semiconductor device comprises a gate structure including a gate electrode, a contact structure including at least one connecting wiring, the contact structure being operatively connected to the gate structure, and an insulated partition configured to insulate the gate structure from the at least one connecting wiring, the insulated partition including insulating films defining a cavity within the insulated partition.

The cavity may be filled with a gaseous medium, and the insulating films may be formed of a material having a dielectric constant higher than a dielectric constant of the gaseous medium.

The contact structure may include a plurality of connecting wirings. The semiconductor device may further include a plurality of insulated partitions, and each of the insulated partitions may be configured to insulate at least one of the plurality of connecting wires from the gate structure.

The insulated partition may include at least one pair of opposing insulated films between the gate structure and the contact structure. The cavity may be between the opposing insulated films.

The cavity may have a cross-sectional area larger than a cross-sectional area of each of the opposing insulating films.

BRIEF DESCRIPTION OF THE DRAWINGS

The above and other aspects and features will become more apparent by describing in detail example embodiments thereof with reference to the attached drawings, in which.

DETAILED DESCRIPTION OF THE EXAMPLE EMBODIMENTS

Figure 1:
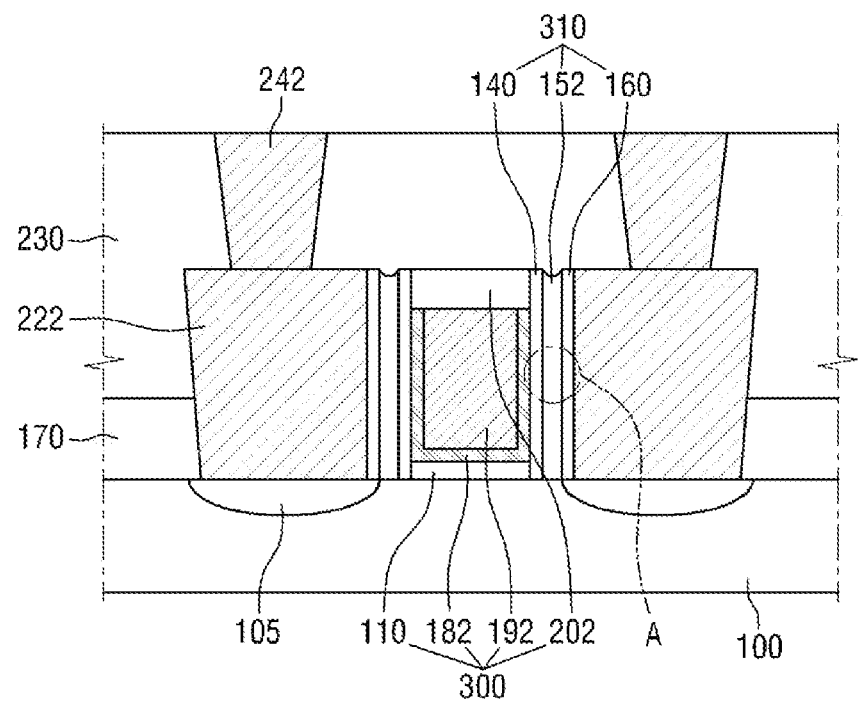
FIG. 1 is a cross-sectional view of a semiconductor device according to an example embodiment.

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings.

Example embodiments relate to semiconductor devices and/or a method of manufacturing the same.

Figure 2:
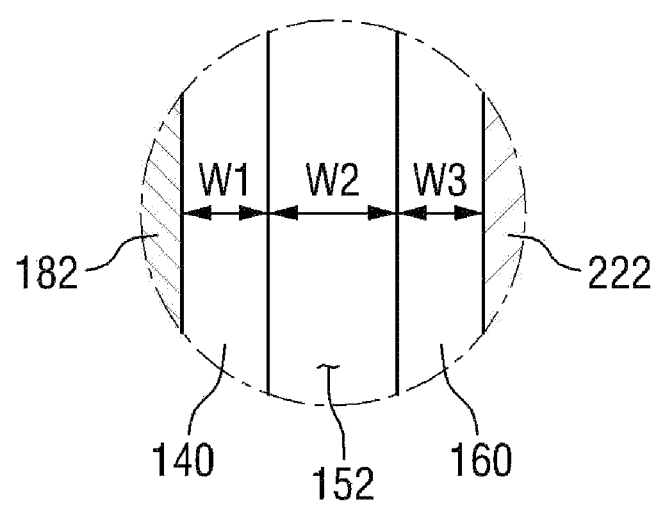
FIG. 2 is an enlarged view of a region A shown in FIG. 1.

FIG. 1 is a cross-sectional view of a semiconductor device according to an example embodiment. FIG. 2 is an enlarged view of a region A shown in FIG. 1.

Referring to FIGS. 1 and 2, a semiconductor device includes a gate structure 300 and a spacer structure 310 formed on both sides of the gate structure 300.

The gate structure 300 may include a gate insulating film pattern 110, a work function metal 182, a gate electrode 192, and a mask film pattern 202.

The gate insulating film pattern 110 formed on a semiconductor substrate 100 may be a high-k film pattern made of a high-k material. Specifically, the gate insulating film pattern 110 may be a high-k metal oxide film pattern. More specifically, the gate insulating film pattern 110 may be, but is not limited to, a metal oxide film pattern made of a material (e.g., hafnium oxide ($HfO_2$), aluminum oxide ($Al_2O_3$), zirconium oxide ($ZrO_2$), or tantalum oxide ($TaO_2$)).

The work function metal 182 for increasing a work function of the gate electrode 192 may be formed on the gate insulating film pattern 110. The work function metal 182 may be a single film made of a metal, a single film made of a metal nitride film, a multi-film made of the metal and the metal nitride film, or a combination of the same. The composition of the work function metal 182 may vary according to the type of carriers existing in a channel region of the semiconductor substrate 100. In some other example embodiments, the work function metal 182 can be omitted as desired.

In some example embodiments, the work function metal 182 may extend upward along both sidewalls of the gate electrode 192, as shown in the drawings. Specifically, the work function metal 182 may be formed between the gate electrode 192 and a first insulating film spacer 140 to extend upward along sidewalls of the gate electrode 192 and the first insulating film spacer 140. Here, a top surface of the work function metal 182 may be at the same height as a top surface of the gate electrode 192, as shown in the drawings.

The gate electrode 192 may be formed on the work function metal 182. In some example embodiments, the gate electrode 192 may be, for example, a replacement metal gate (RMG) electrode. The gate electrode 192 may be a single film made of a metal or a multi-film made of a metal nitride film and the metal. Examples of the metal that forms the gate electrode 192 may include, but not limited to, aluminum (Al), tungsten (W), titanium (Ti), and combinations of the same. In addition, examples of the metal nitride film that forms the gate electrode 192 may include, but not limited to, titanium nitride (TiN), tantalum nitride (TaN), and combinations of the same.

The mask film pattern 202 may be formed on the gate electrode 192. In some example embodiments, the mask film pattern 202 may also be formed on the work function metal 182 to overlap the work function metal 182, as shown in the drawings.

The mask film pattern 202 may serve to protect the gate structure 300 in a process of forming a self-aligned contact 222 which will be described later. Therefore, the mask film pattern 202 may be made of a hard film material. In some example embodiments, the mask film pattern 202 may contain a silicon nitride (SiN) film.

The spacer structure 310 formed on both sides of the gate structure 300 to be adjacent to the gate structure 300 may include the first insulating film spacer 140, an air gap spacer 152, and a second insulating film spacer 160.

The first insulating film spacer 140 is located closest to the gate structure 300 and contacts the gate insulating film pattern 110 and the work function metal 182. The first gate insulating film spacer 140 can prevent the gate insulating film pattern 110 from being removed in a process of forming the air gap spacer 152 which will be described later. That is, the first insulating film spacer 140 can protect the gate insulating film pattern 110 in the process of forming the air gap spacer 152.

Although the mask film pattern 202 and the first insulating film spacer 140 are separate from each other in the drawings, they can be made of substantially the same material (or, alternatively, be integrally formed). In some example embodiments, each of the mask film pattern 202 and the first insulating film spacer 140 may be made of, but is not limited to, a SiN film.

The air gap spacer 152 and the second insulating film spacer 160 may be sequentially formed on an outer side of the first insulating film spacer 140. Here, a thickness W2 of the air gap spacer 152 and thicknesses W1 and W3 of the first and second insulating film spacers 140 and 160 can be adjusted as desired to reduce parasitic capacitance between the self-aligned contact 222 and the gate structure 300.

In some example embodiments, the thickness W2 of the air gap spacer 152 may be different from the thicknesses W1 and W3 of the first and second insulating film spacers 140 and 160. Specifically, the thickness W2 of the air gap spacer 152 may be greater than the thicknesses W1 and W3 of the first and second insulating film spacers 140 and 160.

In some other example embodiments, the thickness W1 of the first insulating film spacer 140 may be substantially equal to the thickness W3 of the second insulating film spacer 160, as shown in the drawings. However, example embodiments are not limited to the illustration in the drawings. Unlike the illustration in the drawings, the thickness W1 of the first insulating film spacer 140 can also be different from the thickness W3 of the second insulating film spacer 160.

The second insulating film spacer 160 formed on an outer side of the air gap spacer 152 may serve to protect the gate structure 300 and the spacer structure 310 in the process of forming the self-aligned contact 222 which will be described later. Therefore, the second insulating film spacer 160 may be made of a hard film material having an etching selectivity with respect to a first interlayer insulating film 170.

In some example embodiments, the second insulating film spacer 160 may contain the same material as the first insulating film spacer 140 and the mask film pattern 202. For example, all of the mask film pattern 202 and the first and second insulating film spacers 140 and 160 may be made of a SiN film.

The self-aligned contact 222 may be formed on both sides of the gate structure 300 and the spacer structure 310. The self-aligned contact 222 may electrically connect a source and drain region 105 formed in the semiconductor substrate 100 to a connecting wiring 242. The self-aligned contact 222 may penetrate (or, alternatively, extend through) the first interlayer insulating film 170. The connecting wiring 242 may be formed on the self-aligned contact 222 and may be electrically connected to an upper contact (not shown) which is electrically connected to an external device. The connecting wiring 242 may penetrate (or, alternatively, extend within) a second interlayer insulating film 230.

In the drawings, the first interlayer insulating film 170 and the second interlayer insulating film 230 are separate from each other. However, in some example embodiments, the first interlayer insulating film 170 and the second interlayer insulating film 230 may be made of the same material. Specifically, the first interlayer insulating film 170 and the second interlayer insulating film 230 may be made of, but not limited to, a silicon oxide ($SiO_2$) film.

As described above, in the semiconductor device according to the current example embodiment, the spacer structure 310, which includes the first insulating film spacer 140, the air gap spacer 152 and the second insulating film spacer 160, is formed on both sides of the gate structure 300. Therefore, the parasitic capacitance between the self-aligned contact 222 and the gate structure 300 can be reduced, thereby improving the operating performance of the semiconductor device. Further, in the semiconductor device according to the current example embodiment, the thicknesses W1 through W3 of the first insulating film spacer 140, the air gap spacer 152 and the second insulating film spacer 160 can be adjusted as desired. Therefore, the parasitic capacitance between the self-aligned contact 222 and the gate structure 300 can be adjusted according to the surrounding environment.

Hereinafter, an example method of manufacturing the above semiconductor device will be described.

FIGS. 3 through 16 are views illustrating intermediate processes included in a method of manufacturing a semiconductor device according to an example embodiment.

Figure 3:
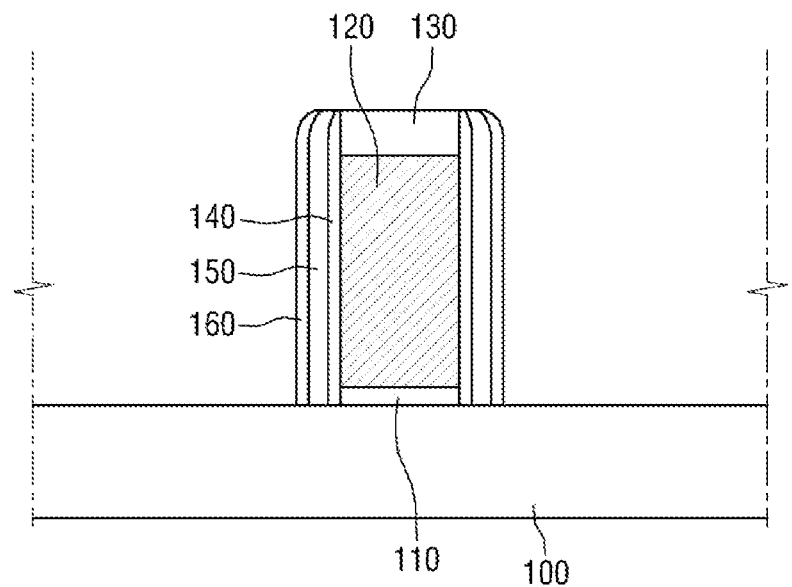
FIGS. 3 through 16 are views illustrating intermediate processes included in a method of manufacturing a semiconductor device according to another example embodiment.

Referring to FIG. 3, a pre-gate structure 110 through 130 and pre-spacer structure 140 through 160 are formed on a semiconductor substrate 100. Here, the pre-gate structure 110 through 130 may include a gate insulating film pattern 110 formed on the semiconductor substrate 100, a dummy gate electrode 120 formed on the gate insulating film pattern 110, and an etch stop film pattern 130 formed on the dummy gate electrode 120. In addition, the pre-spacer structure 140 through 160 may include a first gate insulating film spacer 140 formed on both sides of the pre-gate structure 110 through 130 to contact the gate insulating film pattern 110, and a third insulating film spacer 150 and a second insulating film spacer 160 formed sequentially on an outer side of the first insulating film spacer 140.

The pre-gate structure 110 through 130 and the pre-spacer structure 140 through 160 can be formed using various methods. One of the methods will be described below by way of example.

First, a gate insulating film (not shown), a gate electrode film (not shown), and an etch stop film (not shown) are sequentially stacked on the semiconductor substrate 100 and then patterned to form the pre-gate structure 110 through 130 which includes the gate insulating film pattern 110, the dummy gate electrode 120 and the etch stop film pattern 130 as shown in the drawing.

Here, the gate insulating film (not shown) may be a metal oxide film made of, but not limited to, $HfO_2$, $Al_2O_3$, $ZrO_2$, or $TaO_2$. The gate electrode film (not shown) may be, but is not limited to, a polysilicon film. In addition, the etch stop film (not shown) may be, but is not limited to, a SiN film.

A first insulating film (not shown) is conformally deposited on the semiconductor substrate 100 and the pre-gate structure 110 through 130 and then etched, thereby forming the first insulating film spacer 140 on both sidewalls of the pre-gate structure 110 through 130. A third insulating film (not shown) is conformally deposited on the semiconductor substrate 100, the first insulating film spacer 140, and the pre-gate structure 110 through 130 and then etched, thereby forming the third insulating film spacer 150 on the first insulating film spacer 140. A second insulating film (not shown) is conformally deposited on the semiconductor substrate 100, the third insulating film spacer 150, and the pre-gate structure 110 through 130 and then etched, thereby forming the second insulating film spacer 160 on the third insulating film spacer 150.

Here, the third insulating film (not shown) may be made of a material having an etching selectivity with respect to the first and second insulating films (not shown). Specifically, the third insulating film (not shown) may be a $SiO_2$ film, and the first and second insulating films (not shown) may be SiN films. In some example embodiments, the third insulating film (not shown) may be thicker than the first and second insulating films (not shown).

Figure 4:
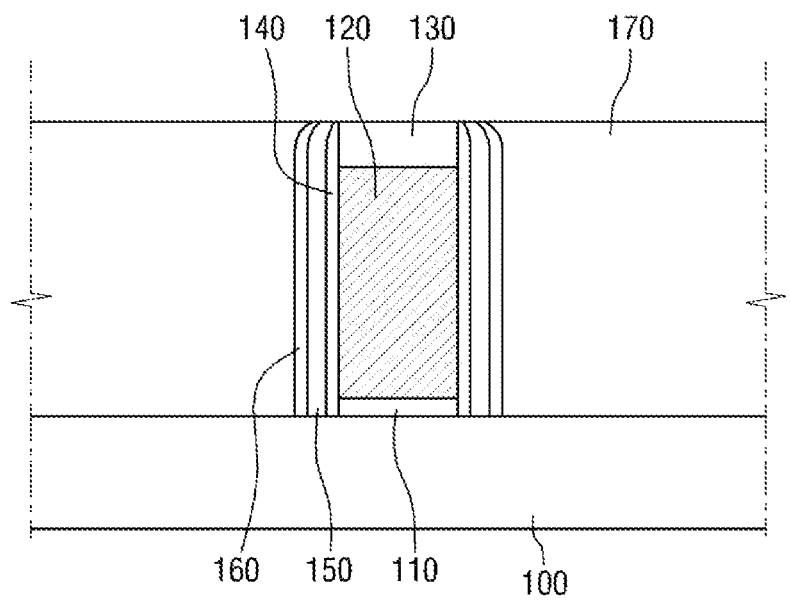

Referring to FIG. 4, a first interlayer insulating film 170 is deposited on the semiconductor substrate 100. Specifically, the first interlayer insulating film 170 is conformally deposited on the semiconductor substrate 100 by chemical vapor deposition (CVD), plasma enhanced CVD (PECVD), or the like. The deposited first interlayer insulating film 170 is planarized until the etch stop film pattern 130 is exposed. In some example embodiments, the first interlayer insulating film 170 may be a $SiO_2$ film.

Referring to FIGS. 5 through 8, the dummy gate electrode 120 is replaced by a metal gate electrode 192.

Figure 5:
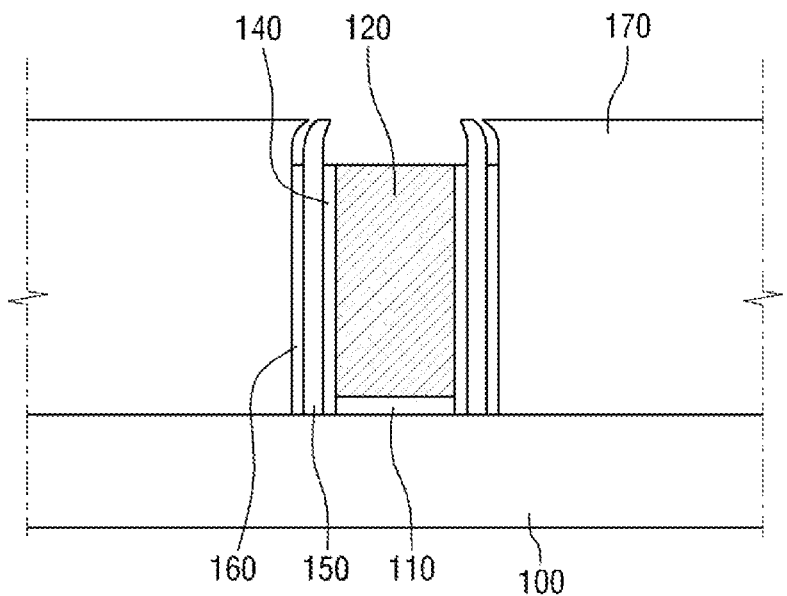

Specifically, referring to FIG. 5, the exposed etch stop film pattern 130 (see FIG. 4) is removed by a dry etching process. The dry etching process may be performed using an etching selectivity between the etch stop film pattern 130 (see FIG. 4) and the first interlayer insulating film 170 and between the etch stop film pattern 130 and the dummy gate electrode 120. Here, if the etch stop film pattern 130 (see FIG. 4) and the first and second insulating film spacers 140 and 160 are made of the same material, upper parts of the first and second insulating film spacers 140 and 160 may also be partially removed as shown in the drawing.

Figure 6:
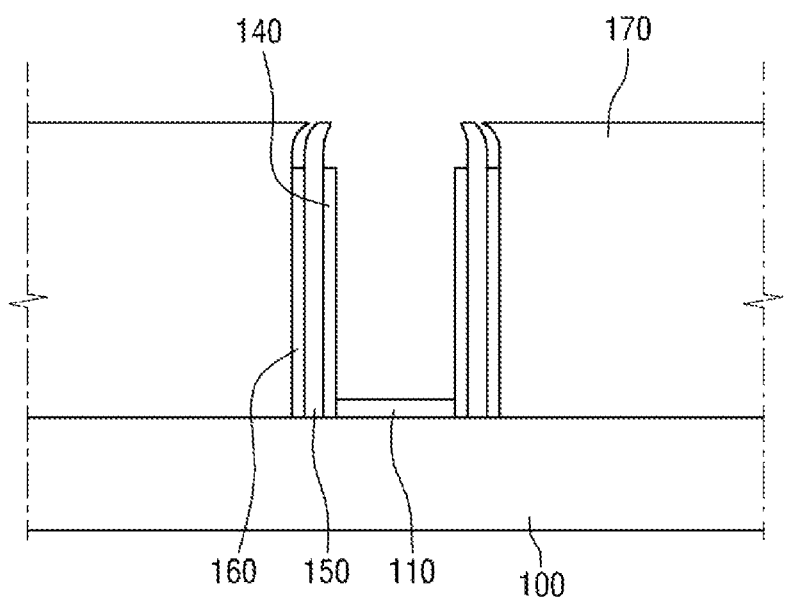

Referring to FIG. 6, the dummy gate electrode 120 (see FIG. 5) is removed by a wet etching process. When the dummy gate electrode 120 (see FIG. 5) is removed, the gate insulating film pattern 110 formed under the dummy gate electrode 120 may be exposed.

Figure 7:
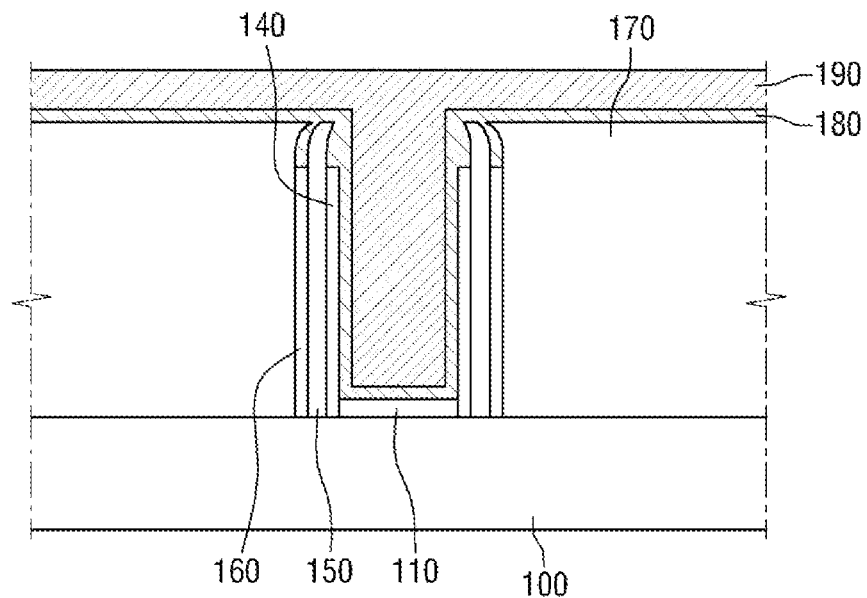

Referring to FIG. 7, a work function metal film 180 is formed on the exposed gate insulating film pattern 110. Here, the deposited work function metal film 180 may extend upward along a sidewall of the first insulating film spacer 140 to be formed on the first interlayer insulating film 170. In the current example embodiment, the work function metal film 180 may be, but is not limited to, a single film made of a metal, a single film made of a metal nitride film, a multi-film made of the metal and the metal nitride film, or a combination of the same.

A metal conductive film 190 is formed on the work function metal film 180. The metal conductive film 190 may be made of a metal with low resistivity. In some example embodiments, the metal conductive film 190 may be made of, but not limited to, Al or W.

Figure 8:
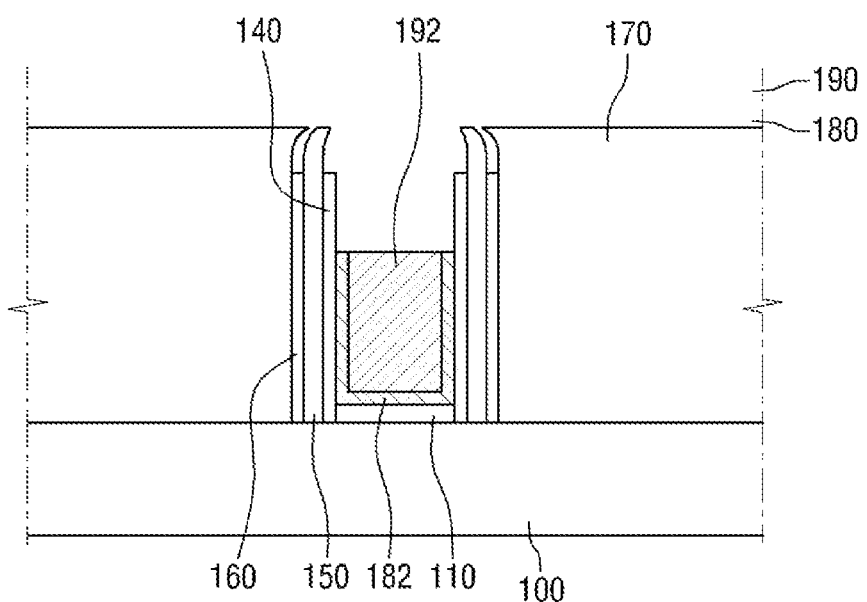

Referring to FIG. 8, the work function metal film 180 (see FIG. 7) and the metal conductive film 190 (see FIG. 7) are partially removed by an etch-back process. As a result, a work function metal 182 and a metal gate electrode 192 are formed. Here, the etch-back process may be performed for a sufficient period of time such that the work function metal 182 and the metal gate electrode 192 become lower than the adjacent first, second and third insulating film spacers 140, 160 and 150.

Referring to FIGS. 9 through 14, a self-aligned contact 222 is formed adjacent to the pre-spacer structure 140 through 160.

Figure 9:
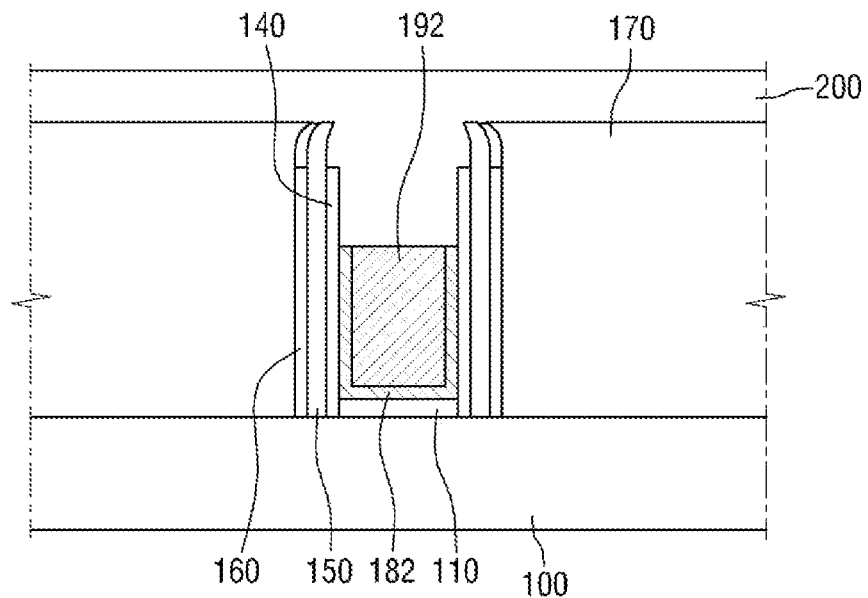

Specifically, referring to FIG. 9, a mask film 200 is formed on the metal gate electrode 192 and the first interlayer insulating film 170. In the current example embodiment, the mask film 200 may be made of substantially the same material as the first and second insulating film spacers 140 and 160. Specifically, the mask film 200 may be a SiN film.

Figure 10:
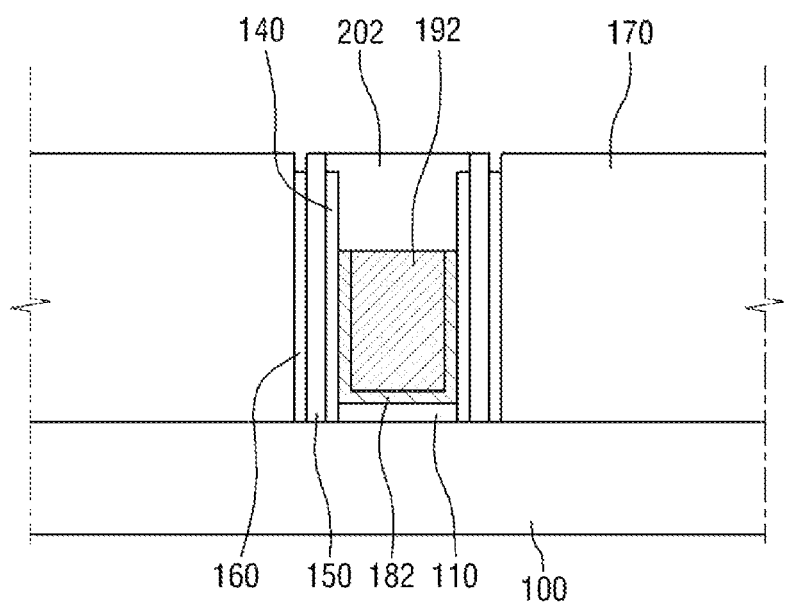

Referring to FIG. 10, the mask film 200 is planarized, thereby forming a mask film pattern 202 on the metal gate electrode 192. Here, upper parts of the first interlayer insulating film 170 and the third insulating film spacer 150 may also be partially removed as shown in the drawing. In some example embodiments, the mask film pattern 202 may also be formed on the first insulating film spacer 140 and the work function metal 182 as shown in the drawing.

Figure 11:
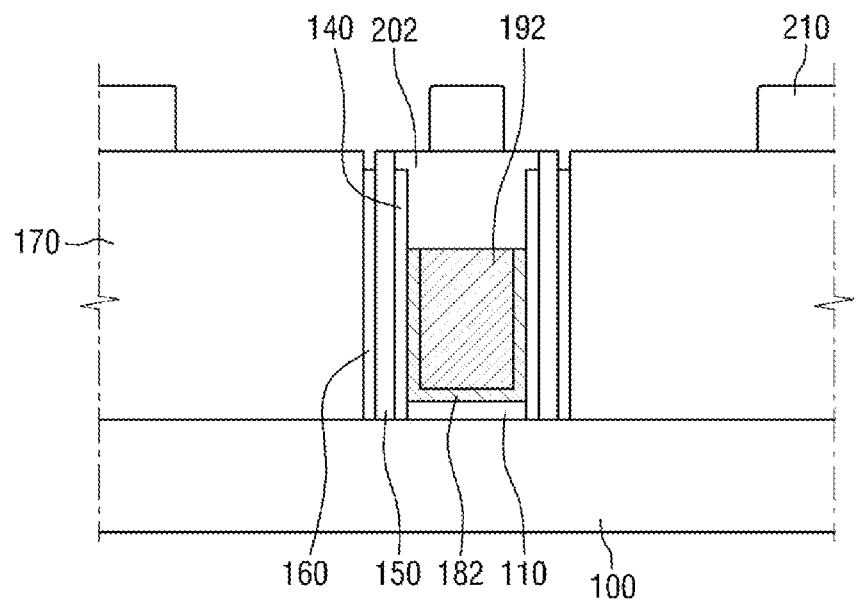
Figure 12:
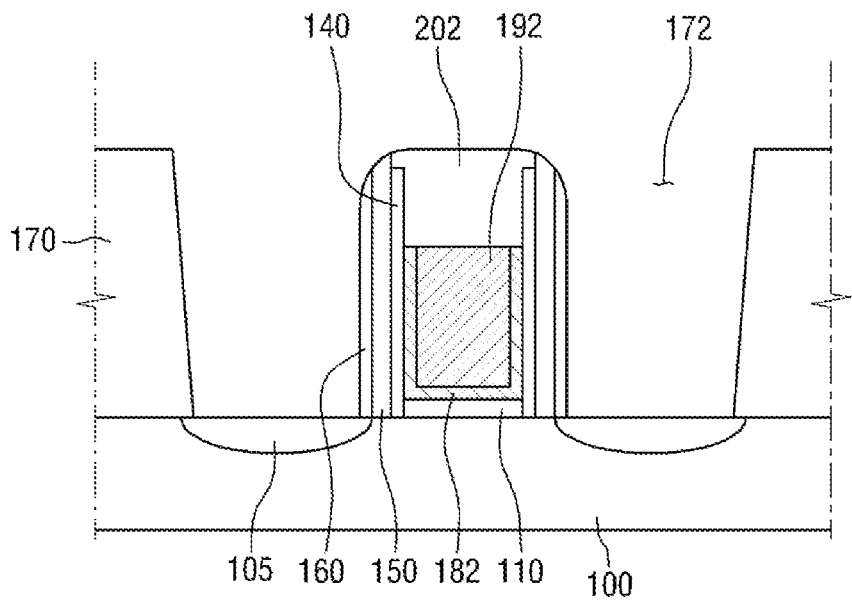

Referring to FIG. 11, an etch mask 210 is formed on the first interlayer insulating film 170 and the mask film pattern 202. Then, referring to FIG. 12, the first interlayer insulating film 170 is etched using the mask film pattern 202 and the etch mask 210 (see FIG. 11) as a mask until the semiconductor substrate 100 is exposed. Accordingly, a contact trench 172 surrounded by the first interlayer insulating film 170 and the pre-spacer structure 140 through 160 is formed on the semiconductor substrate 100, and a sidewall of the second insulating film spacer 160 is exposed.

Predetermined (or, alternatively, select) impurities are injected into the exposed semiconductor substrate 100 to form a source and drain region 105. When necessary, silicide (not shown) is additionally formed in the semiconductor substrate 100.

Figure 13:
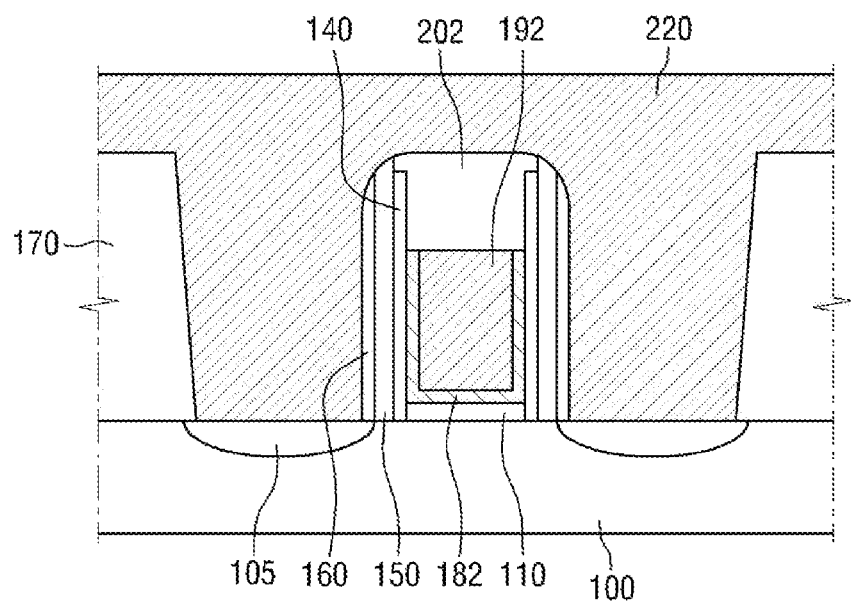

Referring to FIG. 13, the contact trench 172 (see FIG. 12) is filled with a conductive material 220. In the current example embodiment, the conductive material 220 may be a metal (e.g., W). When the conductive material 220 is a metal, a blocking film (not shown) may be formed in the contact trench 172 (see FIG. 12) before the contact trench 172 is filled with the conductive material 220.

Figure 14:
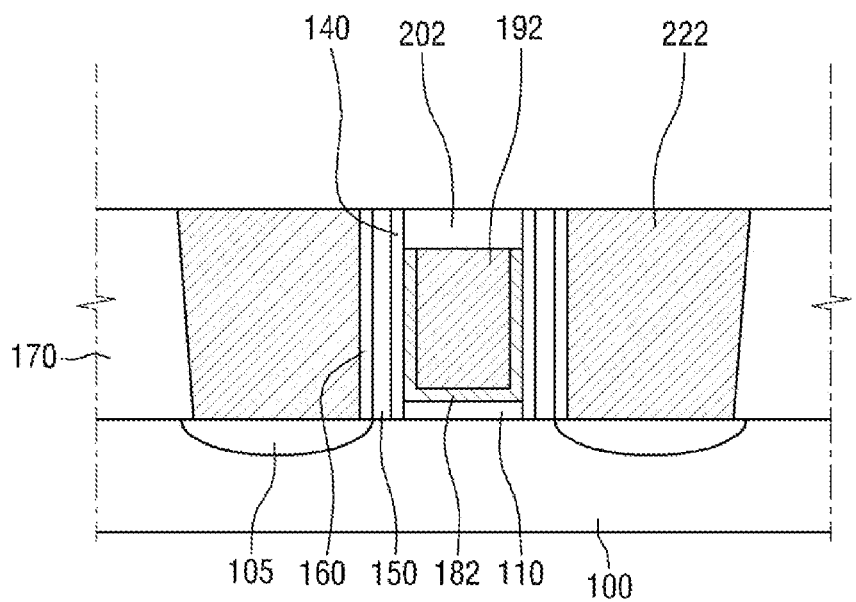

Referring to FIG. 14, the conductive material 220 (see FIG. 13) is planarized by, e.g., a chemical mechanical polishing (CMP) process. As a result, a self-aligned contact 222 is formed adjacent to the pre-spacer structure 140 through 160. Here, upper parts of the first interlayer insulating film 170, the pre-spacer structure 140 through 160, and the mask film pattern 202 may also be partially removed as shown in the drawing.

Figure 15:
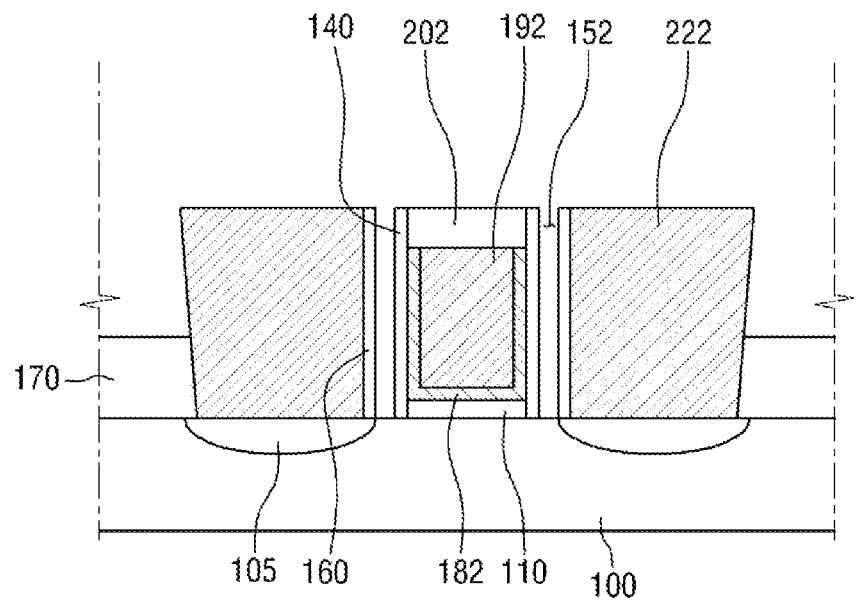

Referring to FIG. 15, the third insulating film spacer 150 (see FIG. 14) is selectively removed using an etching selectivity between the first and second insulating film spacers 140 and 160 and the third insulating film spacer 150 (see FIG. 14). The selective removal of the third insulating film spacer 150 (see FIG. 14) may be achieved by a wet etching process. In this case, the third insulating film spacer 150 (see FIG. 14) may be etched for a sufficient period of time until the semiconductor substrate 100 is exposed.

If the first interlayer insulating film 170 and the third insulating film spacer 150 (see FIG. 14) are made of the same material, the first interlayer insulating film 170 may be etched at the same time as when the third insulating film spacer 150 (see FIG. 14) is etched.

Figure 16:
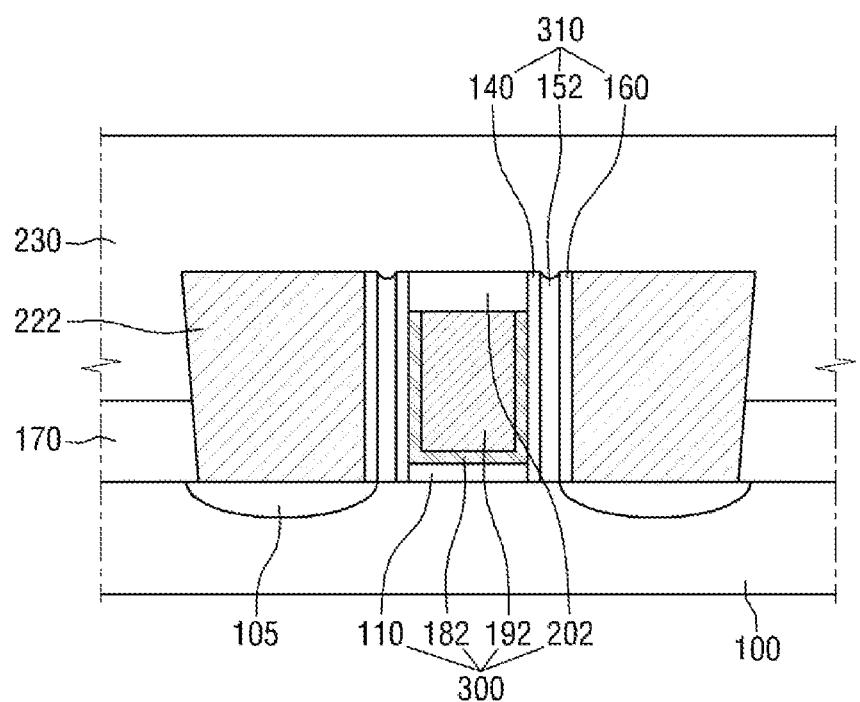

Referring to FIG. 16, a second interlayer insulating film 230 is formed on the first interlayer insulating film 170. The second interlayer insulating film 230 may be deposited on the first interlayer insulating film 170 using a deposition method with poor step coverage. Accordingly, the second interlayer insulating film 230 may not be formed between the first insulating film spacer 140 and the second insulating film spacer 160. Instead, an air gap spacer 152 may be formed between the first insulating film spacer 140 and the second insulating film spacer 160 as shown in the drawing.

Although the first interlayer insulating film 170 and the second interlayer insulating film 230 are separate from each other in the drawing, they may be made of the same material. In some example embodiments, the first interlayer insulating film 170 and the second interlayer insulating film 230 may be $SiO_2$ films.

A connecting wiring trench (not shown) is formed in the second interlayer insulating film 230 and then filled with a conductive material. As a result, a connecting wiring 242 shown in FIG. 1 is formed.

Figure 17:
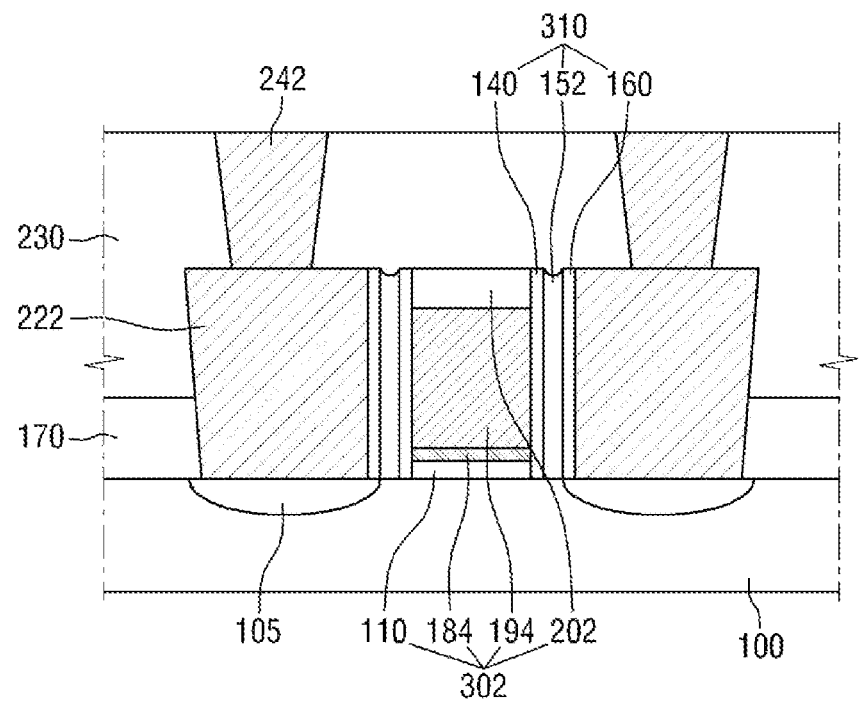
FIG. 17 is a cross-sectional view of a semiconductor device according to yet another example embodiment.

FIG. 17 is a cross-sectional view of a semiconductor device according to yet another example embodiment.

Hereinafter, a semiconductor device according to yet another example embodiment will be described with reference to FIG. 17. For simplicity, a description of elements substantially identical to those of the previous example embodiments will be omitted, and differences between the current and previous example embodiments will mainly be described.

Referring to FIG. 17, a gate structure 302 of the semiconductor device according to the current example embodiment includes a gate insulating film pattern 110, a work function metal 184, a gate electrode 194, and a mask film pattern 202. However, the work function metal 184 does not extend upward along sidewalls of the gate electrode 194 but is formed only under the gate electrode 194.

Accordingly, a first gate insulating film spacer 140 may be formed on both sides of the gate structure 302 to contact all of the gate insulating film pattern 110, the work function metal 184 and the gate electrode 194 as shown in the drawing. The semiconductor device which includes the work function metal 184 and the gate electrode 194 having different shapes from those of their counterparts in the semiconductor device according to the previous example embodiment can also be manufactured using various methods.

Hereinafter, an example method of manufacturing the above semiconductor device will be described.

FIGS. 18 through 24 are views illustrating intermediate processes included in a method of manufacturing a semiconductor device according to still another example embodiment.

Figure 18:
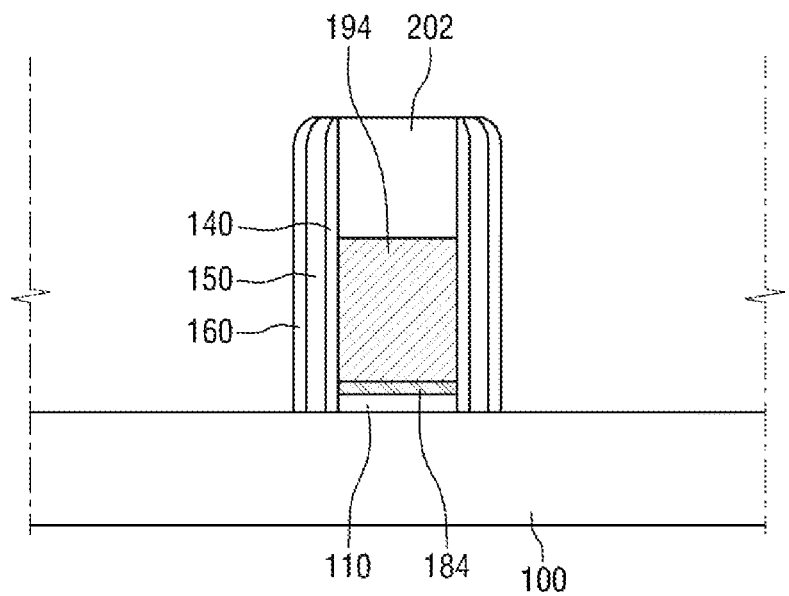
FIGS. 18 through 24 are views illustrating intermediate processes included in a method of manufacturing a semiconductor device according to still another example embodiment.

Referring to FIG. 18, a gate structure 110, 184, 194 and 202 and a pre-spacer structure 140 through 160 are formed on a semiconductor substrate 100. In the current example embodiment, the gate structure 110, 184, 194 and 202 may include a high-k gate insulating film pattern 110 formed on the semiconductor substrate 100, a work function metal 184 formed on the gate insulating film pattern 110, a metal gate electrode 194 formed on the work function metal 184, and a mask film pattern 202 formed on the metal gate electrode 194. That is, in the current example embodiment, the gate structure 110, 184, 194 and 202 does not include a dummy gate electrode 120 (see FIG. 3) made of polysilicon but includes the metal gate electrode 194.

Because the pre-spacer structure 140 through 160 formed on both sides of the gate structure 110, 184, 194 and 202 has been fully described above, a repetitive description thereof will be omitted.

Figure 19:
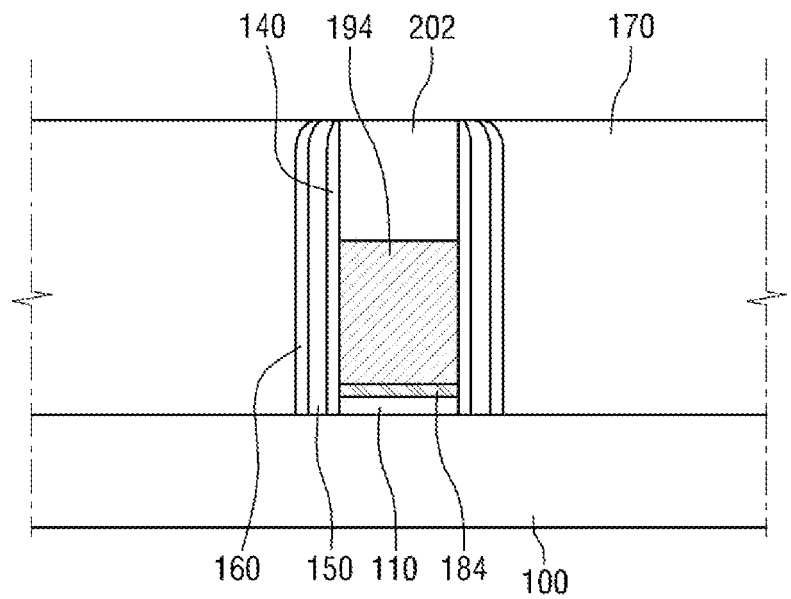

Referring to FIG. 19, a first interlayer insulating film 170 is conformally formed on the semiconductor substrate 100 by, e.g., CVD or PECVD. Then, the deposited first interlayer insulating film 170 is planarized until an etch stop film pattern 130 is exposed. In some example embodiments, the first interlayer insulating film 170 may be a $SiO_2$ film.

Figure 20:
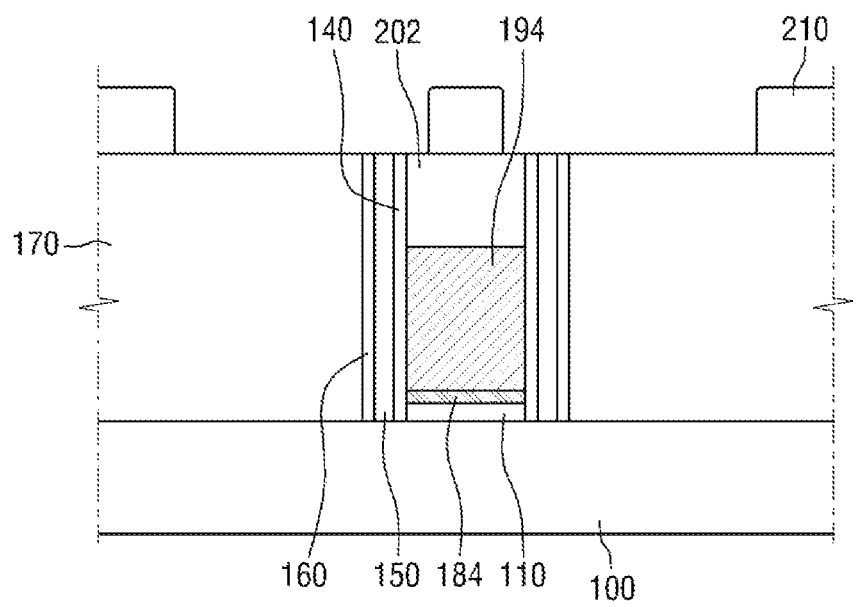
Figure 21:
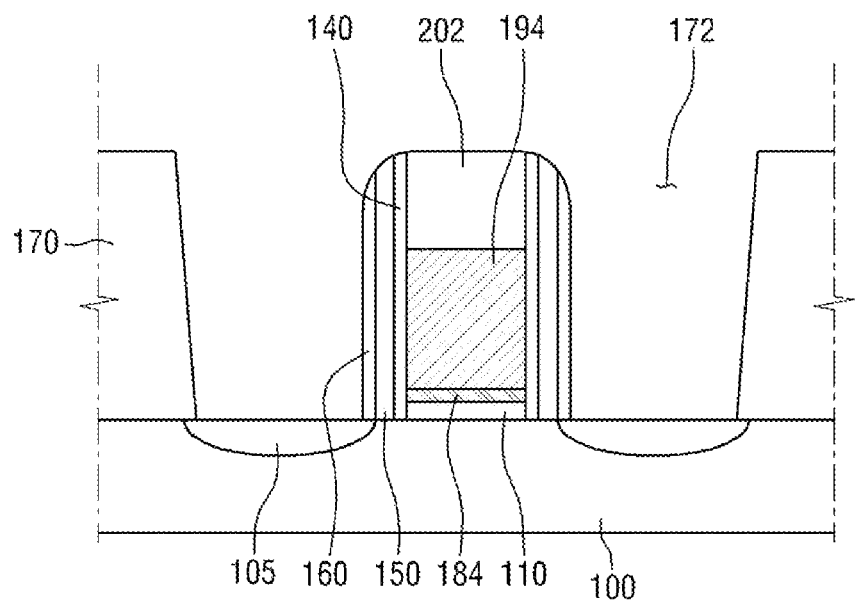

Referring to FIG. 20, an etch mask 210 is formed on the first interlayer insulating film 170 and the mask film pattern 202. Then, referring to FIG. 21, the first interlayer insulating film 170 is etched using the mask film pattern 202 and the etch mask 210 (see FIG. 20) as a mask until the semiconductor substrate 100 is exposed. Accordingly, a contact trench 172 surrounded by the first interlayer insulating film 170 and the pre-spacer structure 140 through 160 is formed on the semiconductor substrate 100. Predetermined (or, alternatively, select) impurities are injected into the exposed semiconductor substrate 100 to form a source and drain region 105.

Figure 22:
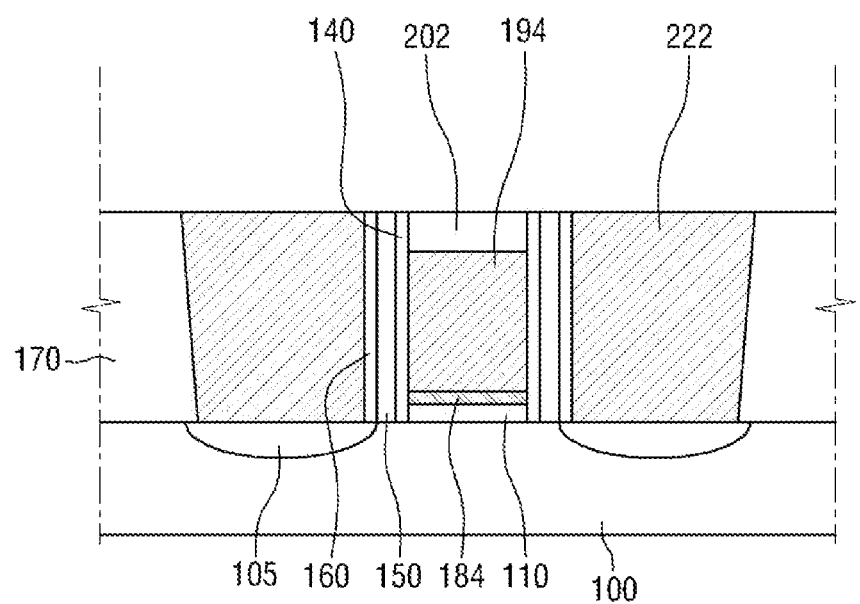

Referring to FIG. 22, the contact trench 172 (see FIG. 21) is filled with a conductive material (not shown), and then the conductive material is planarized by, e.g., a CMP process. As a result, a self-aligned contact 222 is formed adjacent to the pre-spacer structure 140 through 160.

Figure 23:
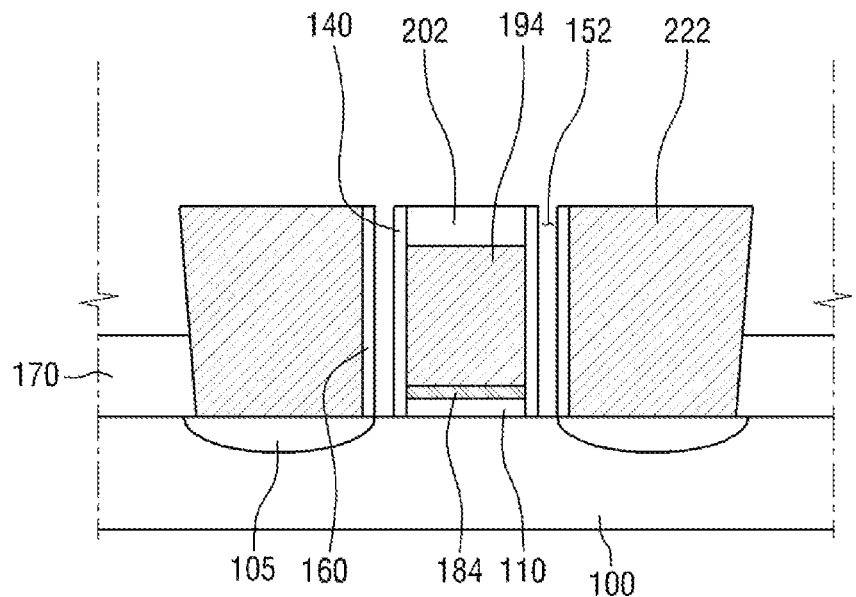

Referring to FIG. 23, a third insulating spacer 150 (see FIG. 22) is selectively removed using an etching selectivity between first and second insulting film spacers 140 and 160 and the third insulating film spacer 150 (see FIG. 22).

Figure 24:
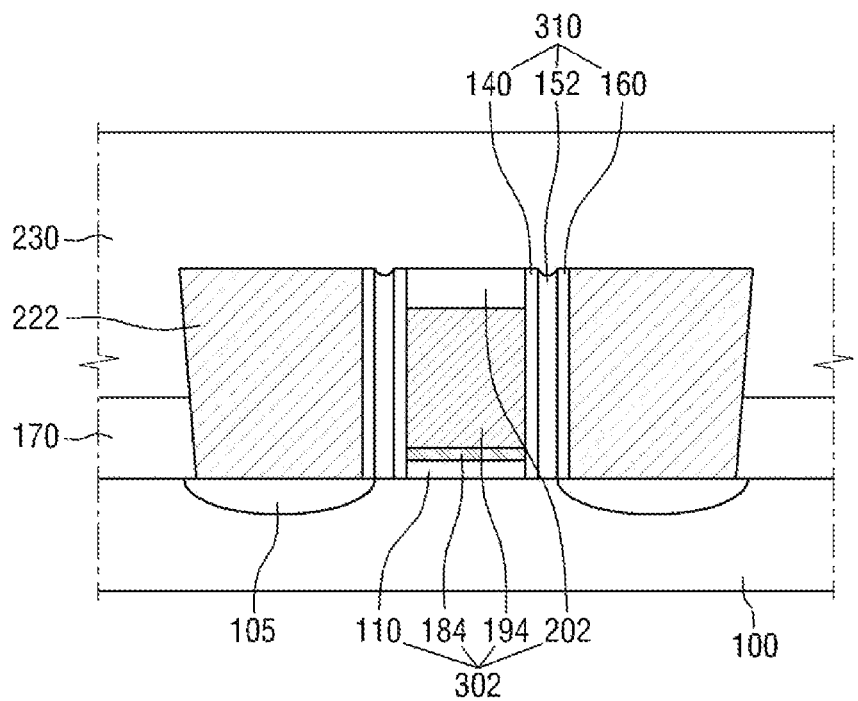

Referring to FIG. 24, a second interlayer insulating film 230 is formed on the first interlayer insulating film 170 using a deposition method with poor step coverage. Accordingly, an air gap spacer 152 is formed between the first insulating film spacer 140 and the second insulating film spacer 160.

A connecting wiring trench (not shown) is formed in the second interlayer insulating film 230 and then filled with a conductive material (not shown). As a result, a connecting wiring 242 shown in FIG. 17 is formed.

Hereinafter, a semiconductor device according to still yet another example embodiment will be described with reference to FIGS. 25 and 26.

Figure 25:
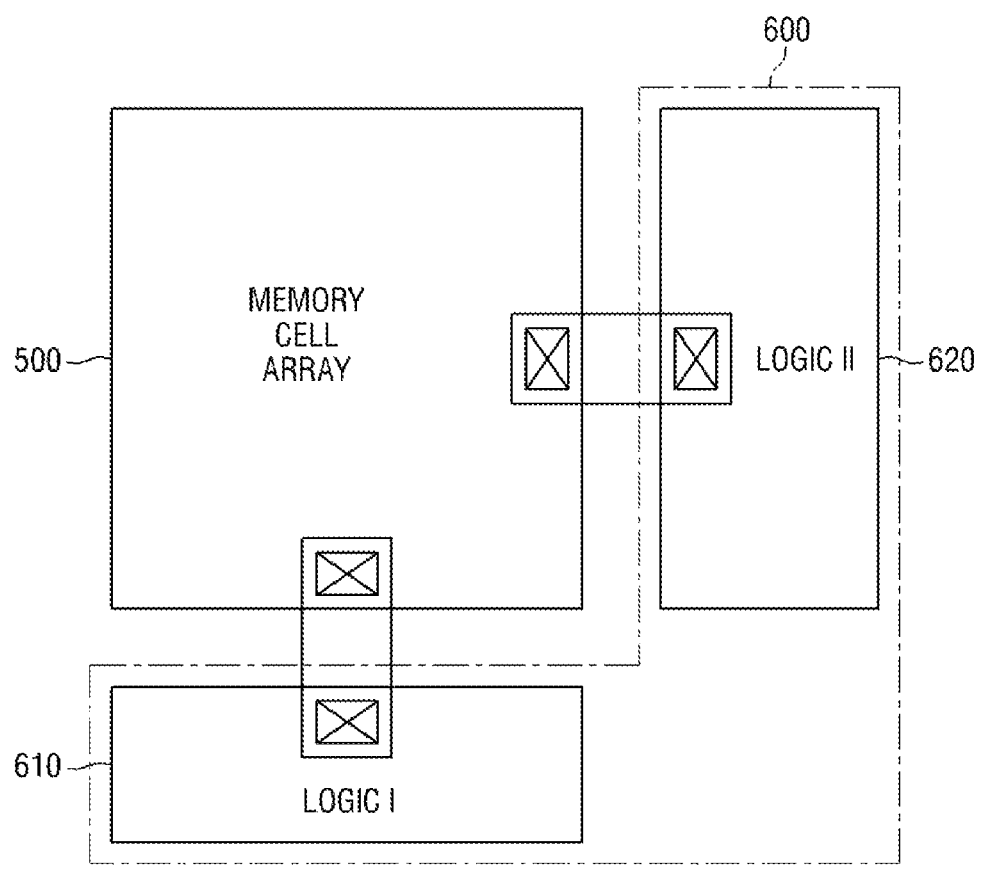
FIG. 25 is a conceptual layout view of a semiconductor device according to still yet another example embodiment.

FIG. 25 is a conceptual layout view of a semiconductor device according to still yet another example embodiment. FIG. 26 is a cross-sectional view of the semiconductor device shown in FIG. 25.

Figure 26:
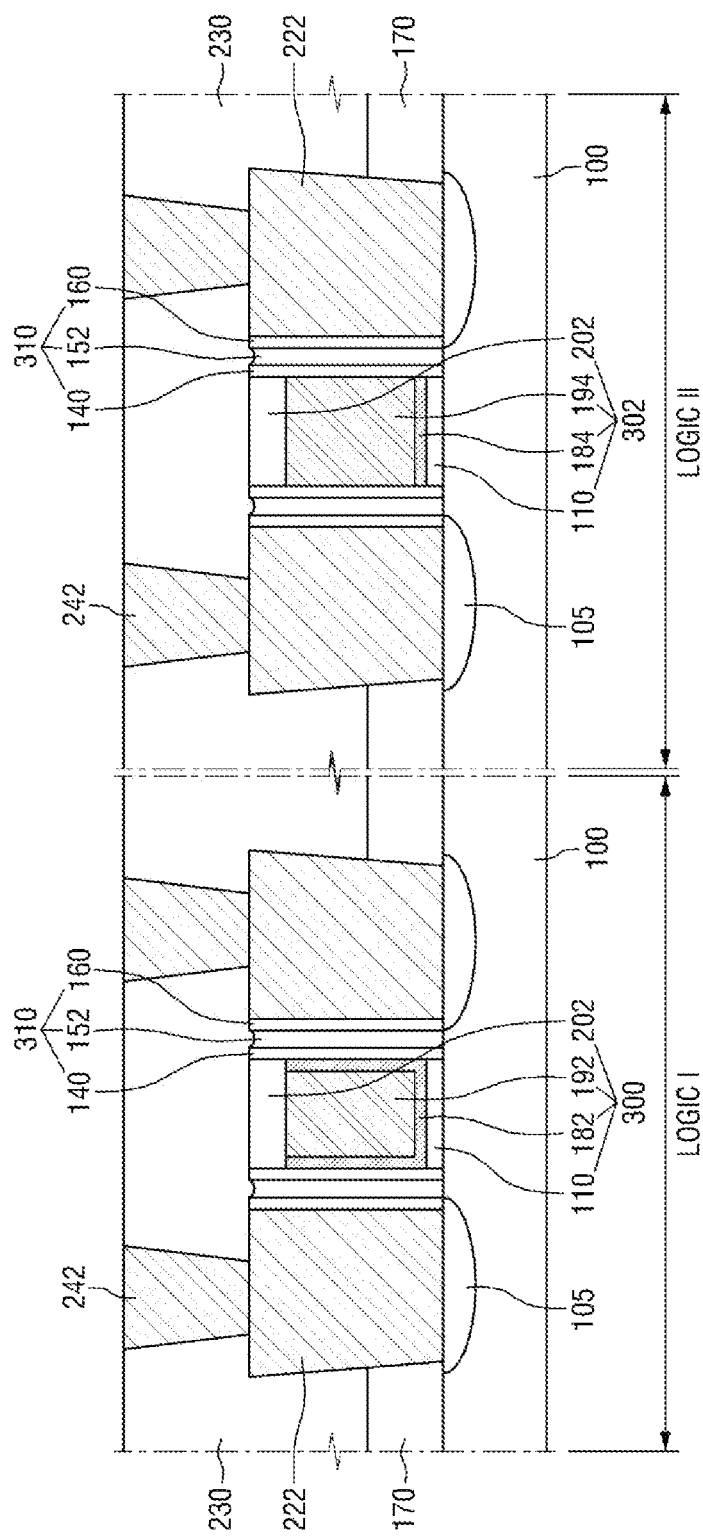
FIG. 26 is a cross-sectional view of the semiconductor device shown in FIG. 25.

Referring to FIGS. 25 and 26, a semiconductor substrate 100 of the semiconductor device according to the current example embodiment may include a memory cell array region 500 and a peripheral circuit region 600 electrically connected to the memory cell array region 500. That is, the semiconductor device according to the current example embodiment may be a memory device that includes the memory cell array region 500 and the peripheral circuit region 600. The peripheral circuit region 600 may include first and second logic regions 610 and 620 which are electrically connected to the memory cell array region 500.

In the current example embodiment, a first gate structure 300 may be formed in the first logic region 610, and a second gate structure 302 may be formed in the second logic region 620. A spacer structure 310 may be formed on both sides of each of the first and second gate structures 300 and 302. The spacer structure 310 includes a first insulating film spacer 140, an air gap spacer 152, and a second insulating film spacer 160 formed sequentially on an outer side of each of the first and second gate structures 300 and 302.

The first gate structure 300 may include a high-k film pattern 110 formed on the semiconductor substrate 100, a first work function metal 182 formed on the high-k film pattern 110 to extend along a sidewall of the first insulating film spacer 140, a first metal gate electrode 192 formed on the first work function metal 182, and a mask film pattern 202 formed on the first metal gate electrode 192.

The second gate structure 302 may include a high-k film pattern 110 formed on the semiconductor substrate 100, a second work function metal 184 formed on the high-k film pattern 110, a second metal gate electrode 194 formed on the second work function metal 184 to contact the first insulating film spacer 140, and a mask film pattern 202 formed on the second metal gate electrode 194.

Other elements are identical to those of the previous example embodiments described above, and thus a detailed description thereof will be omitted.

Figure 27:
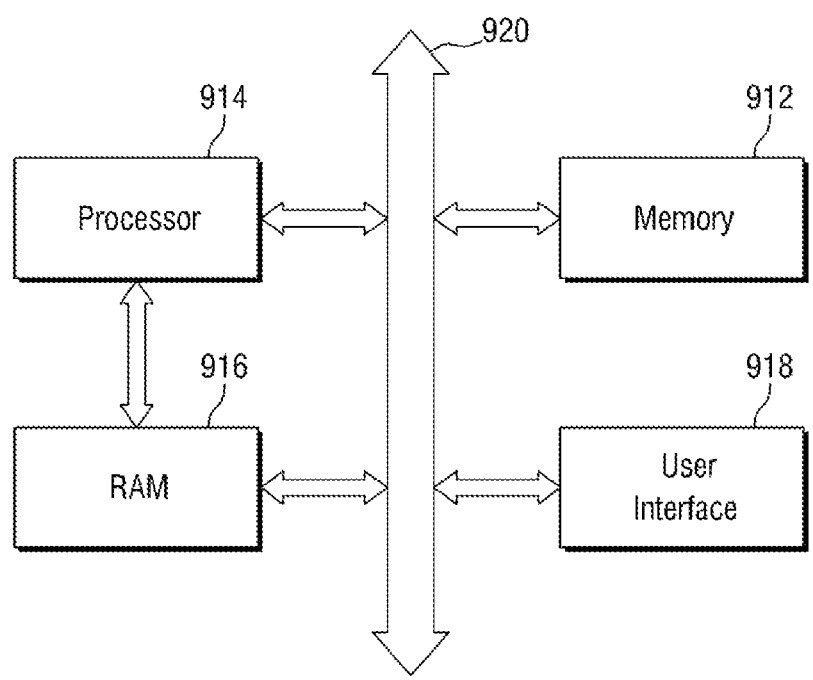
FIG. 27 is a block diagram of an electronic system to which a semiconductor device according to a further example embodiment is applied.

FIG. 27 is a block diagram of an electronic system to which a semiconductor device according to further example embodiments is applied.

Referring to FIG. 27, the electronic system may include a memory system 912, a processor 914, a random access memory (RAM) 916, and a user interface 918. Examples of the electronic system may include a mobile device and a computer.

The memory system 912, the processor 914, the RAM 916, and the user interface 918 may perform data communication with each other using a bus 920. The processor 914 may execute programs and control the electronic system. The RAM 916 can be used as an operation memory of the processor 914.

At least one of the processor 914, the RAM 916, and the memory system 912 may include a semiconductor device according to the above-described example embodiments. In some example embodiments, the processor 914 and the RAM 916 may be included in one package.

The user interface 918 may be used to input or output data to/from the electronic system. The memory system 912 may store codes for operating the processor 914, data processed by the processor 914, or data input from an external source. The memory system 912 may include a controller and a memory.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor device, comprising:
   a gate insulating film pattern over a semiconductor substrate;
   a gate electrode over the gate insulating film pattern;
   a spacer structure on at least one side of the gate electrode and the gate insulating film pattern,
   the spacer structure including,
      a first insulating film spacer contacting the gate insulating film pattern; and
      a second insulating film spacer on an outer side of the first insulating film spacer,
      the semiconductor device having an air gap between the first insulating film spacer and the second insulating film spacer; and
   a self-aligned contact adjacent to the spacer structure.

2. The semiconductor device of claim 1, wherein thicknesses of the first and second insulating film spacers are different from a thickness of the air gap.

3. The semiconductor device of claim 2, wherein the thickness of the air gap is greater than the thicknesses of the first and second insulating film spacers.

4. The semiconductor device of claim 1, further comprising:
   a mask film pattern over the gate electrode.

5. The semiconductor device of claim 4, wherein the mask film pattern and the first insulating film spacer comprise the same materials.

6. The semiconductor device of claim 5, wherein the first insulating film spacer and the second insulating film spacer comprise the same materials.

7. The semiconductor device of claim 1, further comprising:
   an interlayer insulating film on the semiconductor substrate,
   the second insulating film spacer having an etching selectivity with respect to the interlayer insulating film.

8. The semiconductor device of claim 1, wherein the gate electrode comprises a metal gate electrode, and
   the semiconductor device further comprises:
   a metal having a work function formed between the gate insulating film pattern and the metal gate electrode.

9. The semiconductor device of claim 8, wherein the metal having the work function extends along both sidewalls of the metal gate electrode.

10. A semiconductor device, comprising:
    a gate structure including a gate electrode;
    a contact structure including at least one connecting wiring, the contact structure being operatively connected to the gate structure; and
    an insulated partition configured to insulate the gate structure from the at least one connecting wiring, the insulated partition including insulating films defining a cavity within the insulated partition.

11. The semiconductor device of claim 10, wherein,
    the cavity is filled with a gaseous medium, and
    the insulating films are formed of a material having a dielectric constant higher than a dielectric constant of the gaseous medium.

12. The semiconductor device of claim 10, wherein,
    the contact structure includes a plurality of connecting wirings,
    the semiconductor device further comprises:
    a plurality of insulated partitions, each of the insulated partitions being configured to insulate at least one of the plurality of connecting wires from the gate structure.

13. The semiconductor device of claim 10, wherein,
    the insulated partition includes at least one pair of opposing insulated films between the gate structure and the contact structure, and
    the cavity is between the opposing insulated films.

14. The semiconductor device of claim 13, wherein the cavity has a cross-sectional area larger than a cross-sectional area of each of the opposing insulating films.

* * * * *